United States Patent
Lee et al.

(10) Patent No.: US 6,458,717 B1
(45) Date of Patent: Oct. 1, 2002

(54) METHODS OF FORMING ULTRA-THIN BUFFER OXIDE LAYERS FOR GATE DIELECTRICS

(75) Inventors: James Yong Meng Lee; Xia Li; Yunqzang Zhang, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 113 days.

(21) Appl. No.: 09/615,810

(22) Filed: Jul. 13, 2000

(51) Int. Cl.$^7$ ......................... H01L 21/31; H01L 21/469
(52) U.S. Cl. ..................... 438/778; 438/778; 438/787; 438/585; 438/522; 438/473
(58) Field of Search ................ 438/778, 585, 438/426, 450, 787, 473, 522

(56) References Cited

U.S. PATENT DOCUMENTS

| | | | | |
|---|---|---|---|---|
| 4,740,481 A | * | 4/1988 | Wilson et al. | 437/24 |
| 5,488,004 A | * | 1/1996 | Yang | 437/35 |
| 5,872,038 A | | 2/1999 | Duane et al. | 438/279 |
| 5,895,252 A | * | 4/1999 | Lur et al. | 438/423 |
| 5,899,719 A | | 5/1999 | Hong | 438/289 |
| 5,943,576 A | | 8/1999 | Kapoor | 438/302 |
| 5,960,270 A | | 9/1999 | Misra et al. | 438/197 |
| 5,963,818 A | | 10/1999 | Kao et al. | 438/424 |
| 6,069,054 A | * | 5/2000 | Choi | 438/423 |
| 6,087,243 A | * | 7/2000 | Wang | 438/424 |
| 6,110,794 A | * | 8/2000 | Liu | |
| 6,180,487 B1 | * | 1/2001 | Lin | 438/407 |
| 6,194,748 B1 | * | 2/2001 | Yu | 257/216 |
| 6,204,124 B1 | * | 3/2001 | Wu | 438/264 |
| 6,204,546 B1 | * | 3/2001 | Roitman et al. | 257/506 |
| 6,207,505 B1 | * | 3/2001 | Wu | 438/264 |
| 6,211,016 B1 | * | 4/2001 | Wu | 438/264 |
| 6,232,241 B1 | * | 5/2001 | Yu et al. | 438/749 |
| 6,248,637 B1 | * | 6/2001 | Yu | 438/300 |
| 6,107,140 A1 | * | 8/2001 | Lee et al. | 438/259 |
| 6,284,582 B1 | * | 9/2001 | Yu | 438/202 |
| 6,306,741 B1 | * | 10/2001 | Lee et al. | 438/585 |
| 6,309,927 B1 | * | 10/2001 | Au et al. | 438/261 |

* cited by examiner

Primary Examiner—Matthew Smith
Assistant Examiner—Granvill D. Lee, Jr.
(74) Attorney, Agent, or Firm—George O. Saile; Rosemary L. S. Pike; Stephen G. Stanton

(57) ABSTRACT

A first option is a method of forming an ultra thin buffer oxide layer comprises the following steps. A silicon substrate having STI regions formed therein separating at least one active area is provided. The silicon substrate has an upper surface. A sacrificial oxide layer is formed over the silicon substrate and the STI regions. Oxygen is implanted within the silicon substrate. The oxygen implant having a peak concentration proximate the upper surface of the silicon substrate. The sacrificial oxide layer is stripped and removed. A gate dielectric layer is formed over the silicon substrate. A conductor layer is deposited over the gate dielectric layer. The structure is annealed to form ultra-thin buffer oxide layer between the silicon substrate and the gate dielectric layer. A second option is a method of forming an ultra-thin buffer oxide layer, comprises the following steps. A silicon substrate having STI regions formed therein separating at least one active area is provided. The silicon substrate has an upper surface. A gate dielectric layer is formed over the silicon substrate and the STI regions. A sacrificial oxide layer is formed over the gate dielectric layer. Oxygen is implanted within the silicon substrate. The oxygen implant having a peak concentration proximate the upper surface of the silicon substrate. The sacrificial oxide layer is stripped and removed. A conductor layer is deposited over the gate dielectric layer. The structure is annealed to form ultra-thin buffer oxide layer between the silicon substrate and the gate dielectric layer.

30 Claims, 3 Drawing Sheets

METHODS OF FORMING ULTRA-THIN BUFFER OXIDE LAYERS FOR GATE DIELECTRICS

FIELD OF THE INVENTION

The present invention relates generally to methods of forming semiconductor devices and specifically to methods of forming ultra-thin buffer oxide layers below the gate dielectric in semiconductor device fabrication.

BACKGROUND OF THE INVENTION

Many current processes for forming the thin buffer oxide layer below the SiN (silicon nitride) gate dielectric involves either a furnace or Rapid Thermal Oxidation (RTO). Other methods involve an extremely dilute HF oxide etch back from a thicker grown oxide (SiO).

It is extremely difficult to grow an oxide thickness of less than 10 Å with the traditional furnace oxidation. Even with RTO oxidation, controlling the oxide thickness is an issue for thicknesses less than 10 Å. With the oxide etch back process using extremely dilute HF, i.e. >100:1, control and uniformity is also difficult to maintain.

U.S. Pat. No. 5,963,818 to Kao et al. describes a method for forming an integrated circuit involves forming trench isolation regions and a damascene gate electrode region simultaneous with one another by over-lapping process steps using, inter alia, an inverse poly gate CMP.

U.S. Pat. No. 5,960,270 to Misra et al. describes a method for forming a metal gate MOS transistor using an inverse poly gate CMP. Source and drain regions are formed within a substrate self-aligned to a lithographically patterned feature. The patterned feature is then removed and replaced by a metallic gate layer that is chemically mechanically polished (CMP) to form a metallic plug region that is either an inlaid or dual inlaid. The metallic plug region is self-aligned to the source and drain regions and preferably functions as a metal MOS gate region.

U.S. Pat. No. 5,943,576 to Kapoor describes a method of forming a MOS transistor having a narrow diffusion region that is smaller than the diffusion region defined using photoresist in a conventional CMOS processing. The method includes an inverse poly gate with sidewall spacers process.

U.S. Pat. No. 5,899,719 to Hong describes a method for making an FET (field effect transistor) having narrower gate electrodes and forming source/drain regions, including halo implants, in a more controlled manner. The method includes an inverse poly gate with sidewall spacers process.

U.S. Pat. No. 5,872,038 to Duane et al. describes a process for forming a semiconductor device having an elevated active region. A plurality of gate electrodes is formed on the semiconductor substrate an a thick oxide layer is disposed over the gate electrodes. A trench is formed in the thick oxide layer and is filled with a polysilicon material that is later doped to form an elevated active region above an active region of the substrate. The process includes a plain inverse poly gate CMP process.

SUMMARY OF THE INVENTION

Accordingly, it is an object of the present invention to provide a method of forming an extremely thin (3–10 Å) buffer oxide layer.

Another object of the present invention is to provide a method of forming buffer oxide layers for SiN gate dielectrics by accurate control of the oxygen implant dose to permit formation of ultra thin (3–10 Å) buffer oxide layers.

Other objects will appear hereinafter.

It has now been discovered that the above and other objects of the present invention may be accomplished in the following manner. Specifically, the first option is a method of forming an ultra thin buffer oxide layer comprising the following steps. A silicon substrate having STI regions formed therein separating at least one active area is provided. The silicon substrate has an upper surface. A sacrificial oxide layer is formed over the silicon substrate and the STI regions. Oxygen is implanted within the silicon substrate. The oxygen implant having a peak concentration proximate the upper surface of the silicon substrate. The sacrificial oxide layer is stripped and removed. A gate dielectric layer is formed over the silicon substrate. A conductor layer is deposited over the gate dielectric layer. The structure is annealed to form ultra-thin buffer oxide layer between the silicon substrate and the gate dielectric layer.

The second option is a method of forming an ultra-thin buffer oxide layer, comprising the following steps. A silicon substrate having STI regions formed therein separating at least one active area is provided. The silicon substrate has an upper surface. A gate dielectric layer is formed over the silicon substrate and the STI regions. A sacrificial oxide layer is formed over the gate dielectric layer. Oxygen is implanted within the silicon substrate. The oxygen implant having a peak concentration proximate the upper surface of the silicon substrate. The sacrificial oxide layer is stripped and removed. A conductor layer is deposited over the gate dielectric layer. The structure is annealed to form ultra-thin buffer oxide layer between the silicon substrate and the gate dielectric layer.

BRIEF DESCRIPTION OF THE DRAWINGS

The features and advantages of the methods according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all processes, structures, layers, etc. may be performed, formed or accomplished by conventional methods known in the prior art.

First Option of the Invention

FIGS. 1 to 4 illustrate the second preferred option of the present invention.

Figure 1:
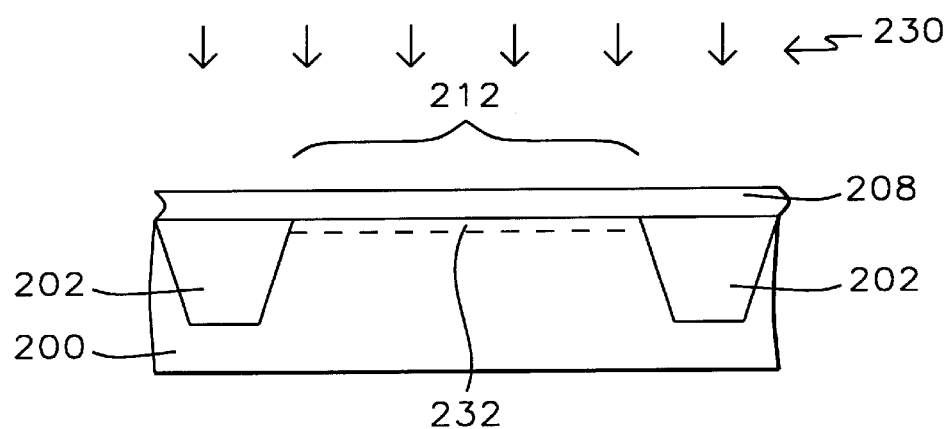
FIGS. 1 to 4 schematically illustrate, in cross-sectional representation, a first preferred option made in accordance with the present invention.

Accordingly, as shown in FIG. 1, starting silicon substrate 200 may include a semiconductor wafer and has shallow isolation trenches (STI) regions 202 formed therein separating active area 212. Although only two STI regions 202 and one active area 212 are illustrated in FIG. 1, it is understood multiple STI regions could be formed within silicon substrate 200 separating multiple active areas.

Sacrificial oxide layer 208 is formed over silicon substrate 200 and STI regions 202 to a thickness of from about 90 to 110 Å, more preferably from about 95 to 105 Å, and most preferably about 100 Å. Sacrificial oxide layer 208 serves to protect silicon substrate 200 from any implant contamination in the subsequent implant steps.

Well and channel implantations may then be performed (not shown).

An oxygen implantation (at 230) is then carried out at a dose from about $1\ E^{14}$ to $1\ E^{16}\ cm^{-2}$ at an optimal energy so as to place the peak oxygen concentration just below the silicon substrate as at 232.

The peak oxygen concentration 232 preferably has depth below the substrate surface between about 20 and 150 Å. Depending upon the thickness of sacrificial oxide layer 208, the oxygen implantation energy may vary from about 10 to 50 keV.

Figure 2:
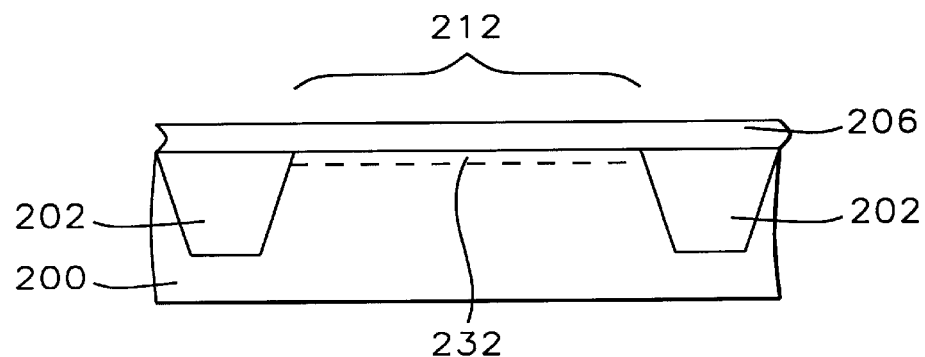

As shown in FIG. 2, sacrificial oxide layer 208 is stripped. (prior to Rapid Thermal Nitridation (RTN)). Sacrificial oxide layer 208 may be stripped using an isotropic HF wet etch or DHF strip.

During an RTN process, nitride (SiN) or a high k dielectric (such as $Ta_2O_5$, $Ta_3O_5$, or $TiO_2$) gate dielectric layer 206 is formed through a controlled chemical vapor deposition (CVD) process. Preferably, gate dielectric layer 206 is comprised of SiN as will be used hereafter. SiN gate dielectric layer 206 has a thickness from about 10 to 50 Å, more preferably from about 20 to 30 Å, and most preferably about 25 Å.

Figure 3:
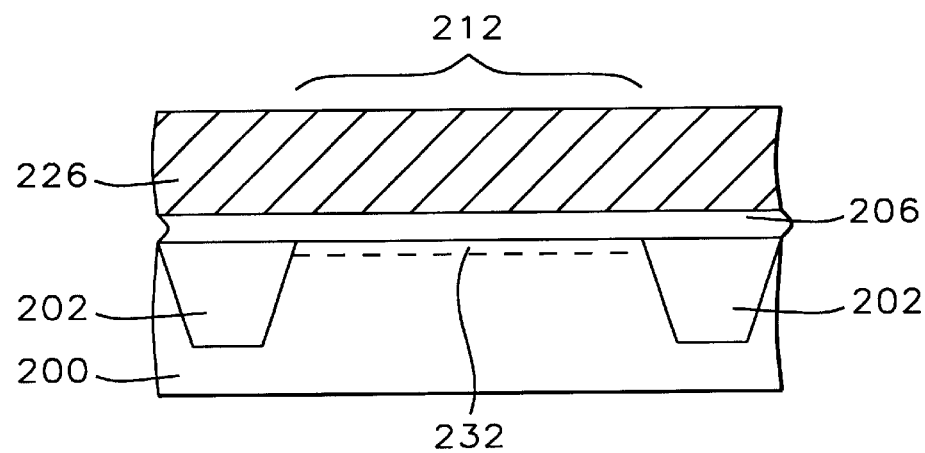

As shown in FIG. 3, thick conductor layer 226 is deposited over SiN gate dielectric layer 206. Conductor layer 226 has a thickness from about 2250 to 2750 Å, more preferably from about 2400 to 2600 Å, and most preferably about 2500 Å. Conductor layer 226 may be polysilicon (poly) or a metal, for example.

Figure 4:
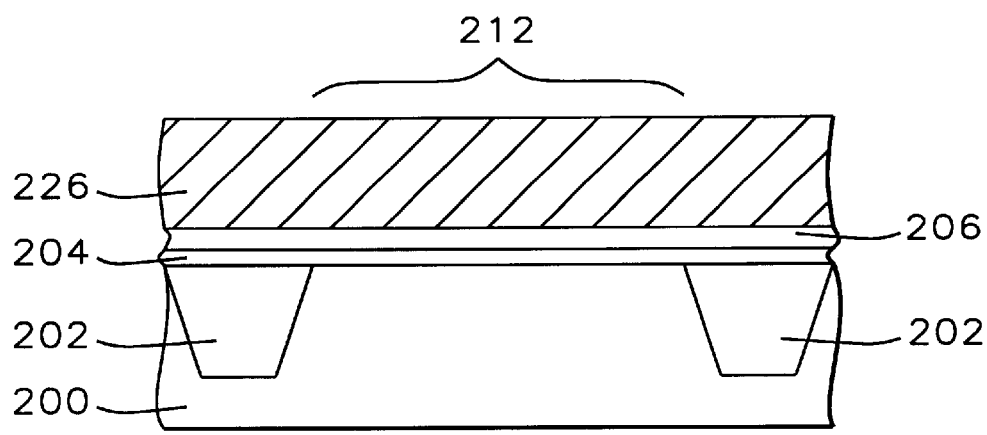

As shown in FIG. 4, a furnace anneal is then performed from about 715 to 985° C. for about 5 to 25 seconds, more preferably from about 750 to 950° C. for about 10 to 20 seconds, and most preferably from about 800 to 900° C. for about 10 to 20 seconds. This causes the oxygen atoms introduced through the oxygen implantation 230 to pile up at the SiN gate dielectric layer 206/Si substrate 200 interface. Oxidation of Si substrate 200 occurs at the SiN gate dielectric layer 206/Si substrate 200 interface and ultra-thin buffer oxide layer 204 is formed having a thickness from about 3 to 25 Å, more preferably from about 3 to 15 Å, and most preferably from about 3 to 10 Å.

By adjusting the oxygen implant dosage, the desired ultra-thin buffer oxide 204 thickness may be achieved.

This method allows formation of an ultra-thin buffer oxide layer 204 through the accurate control of the oxygen implant dose.

Afterwards, the conductor layer 226, SiN layer 206 and oxide 204 are patterned to create gate electrodes (not shown). Further processing forms S/D regions, conductive interconnection to create transistors and other devices.

Second Option of the Invention

FIGS. 5 to 9 illustrate the second preferred option of the present invention.

Figure 5:
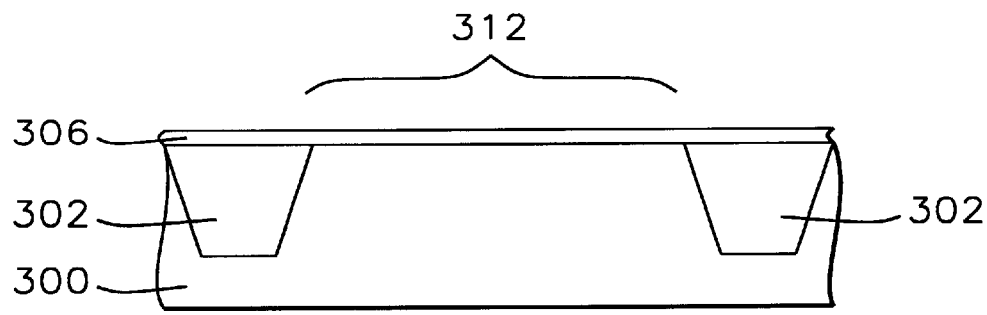
FIGS. 5 to 9 schematically illustrate, in cross-sectional representation, a second preferred option made in accordance with the present invention.
Figure 9:
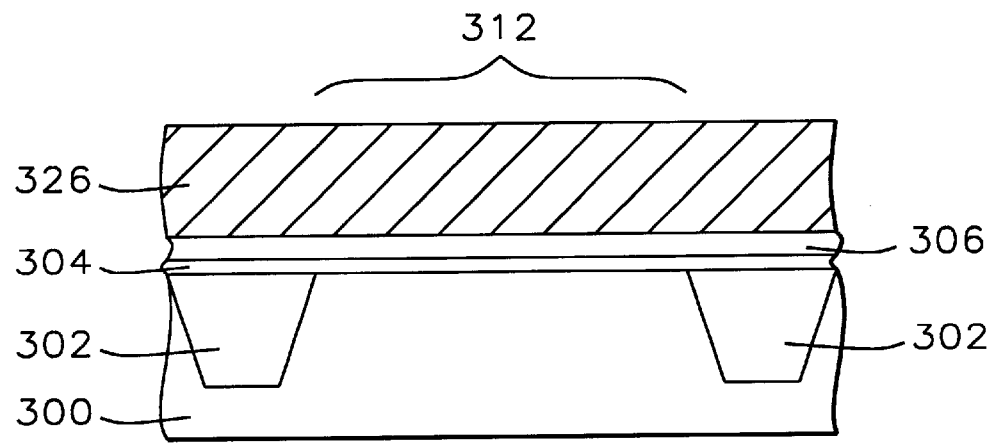

Accordingly, as shown in FIG. 5, starting silicon substrate 300 may include a semiconductor wafer and has shallow isolation trenches (STI) regions 302 formed therein separating active area 312. Although only two STI regions 302 and one active area 312 are illustrated in FIG. 9, it is understood multiple STI regions could be formed within silicon substrate 300 separating multiple active areas.

The upper surface of silicon substrate 300 is then cleaned prior to Rapid Thermal Nitridation (RTN). During the RTN process, nitride (SiN), or high k dielectric (such as $Ta_2O_5$, $Ta_3O_5$, or $TiO_2$), gate dielectric layer 306 is formed through a controlled chemical vapor deposition (CVD) process. Preferably, gate dielectric layer 306 is comprised of SiN as will be used hereafter. SiN gate dielectric layer 306 has a thickness from about 10 to 50 Å, more preferably from about 20 to 30 Å, and most preferably about 25 Å.

Figure 6:
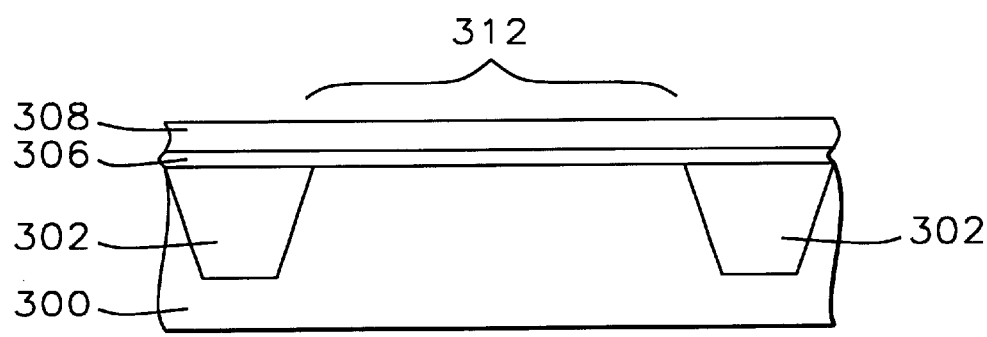

As shown in FIG. 6, sacrificial oxide layer 308 is formed over SiN gate dielectric layer 306 to a thickness of from about 90 to 110 Å, more preferably from about 95 to 105 Å, and most preferably about 100 Å. Sacrificial oxide layer 308 serves to protect SiN gate dielectric layer 306 from any implant contamination in the subsequent implant step.

Well and channel implantations may then be performed (not shown).

Figure 7:
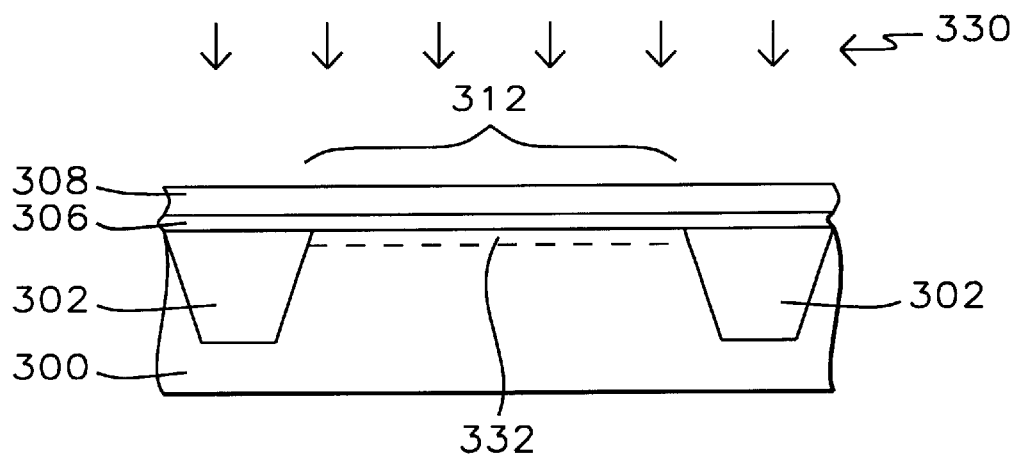

As shown in FIG. 7, an oxygen implantation (at 330) is then carried out at a dose from about $1\ E^{14}$ to $1\ E^{16}\ cm^{-2}$ at an optimal energy so as to place the peak oxygen concentration just below the silicon substrate as at 332. The oxygen implant dosage and energy may be adjusted to optimize the required buffer oxide 304 thickness (see below). The oxygen implantation energy may vary from about 10 to 50 keV.

Figure 8:
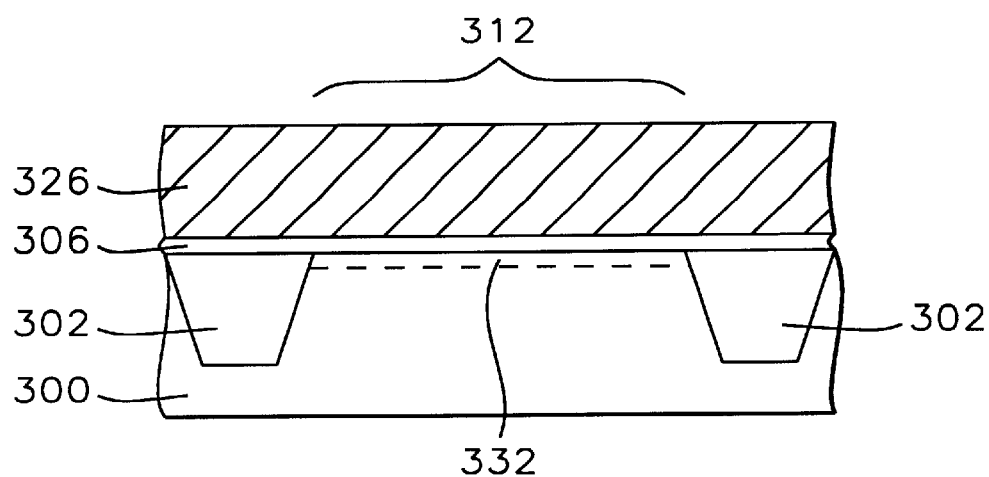

As shown in FIG. 8, sacrificial oxide layer 308 is stripped, preferably using an isotropic HF wet etch or DHF strip.

Thick conductor layer 326 is then deposited over SiN gate dielectric layer 306. Conductor layer 326 has a thickness from about 2250 to 2750 Å, more preferably from about 2400 to 2600 Å, and most preferably about 2500 Å. Conductor layer 326 may be polysilicon (poly) or a metal, for example.

As shown in FIG. 9, a furnace anneal is then performed from about 715 to 985° C. for about 5 to 25 seconds, more preferably from about 750 to 950° C. for about 10 to 20 seconds, and most preferably from about 800 to 900° C. for about 10 to 20 seconds. This causes the oxygen atoms introduced through the oxygen implantation 330 to pile up at the SiN gate dielectric layer 306/Si substrate 300 interface. Oxidation of Si substrate 300 occurs at the SiN gate dielectric layer 306/Si substrate 300 interface and ultra-thin buffer oxide layer 304 is formed having a thickness from about 3 to 25 Å, more preferably from about 3 to 15 Å, and most preferably from about 3 to 10 Å.

As referenced above, by adjusting the oxygen implant dosage, the desired ultra-thin buffer oxide 304 thickness may be achieved.

This method allows formation of an ultra-thin buffer oxide layer 304 through the accurate control of the oxygen implant dose.

Afterwards, the conductor layer 326, SiN gate dielectric layer 306 and oxide 304 are patterned to create gate electrodes (not shown). Further processing forms S/D regions, conductive interconnection to create transistors and other devices.

While particular embodiments of the present invention have been illustrated and described, it is not intended to limit the invention, except as defined by the following claims.

We claim:

1. A method of forming an ultra-thin buffer oxide layer, comprising the following steps:

providing a silicon substrate having STI regions formed therein separating at least one active area; said silicon substrate having an upper surface;

forming a sacrificial oxide layer over said silicon substrate and said STI regions;

implanting oxygen within said silicon substrate; said oxygen implant having a peak concentration proximate said upper surface of said silicon substrate;

stripping and removing said sacrificial oxide layer;

forming a gate dielectric layer over said silicon substrate;
depositing a conductor layer over said gate dielectric layer;
annealing the structure to form ultra-thin buffer oxide layer between said silicon substrate and said gate dielectric layer.

2. The method of claim 1, wherein said sacrificial oxide layer is from about 95 to 105 Å thick; said gate dielectric layer is from about 10 to 50 Å; said conductor layer is from about 2400 to 2600 Å thick; and said ultra-thin buffer oxide layer is from about 3 to 15 Å thick.

3. The method of claim 1, wherein said sacrificial oxide layer is about 100 Å thick; said gate dielectric layer is from about 20 to 30 Å; said conductor layer is about 2500 Å thick; and said ultra-thin buffer oxide layer is from about 3 to 10 Å thick.

4. The method of claim 1, wherein said oxygen implantation is performed at a dose from about $1E^{14}$ to $1E^{16}$ cm$^{-2}$ and an energy from about 10 to 50 keV.

5. The method of claim 1, wherein said gate dielectric layer is formed using a Rapid Thermal Nitridation (RTN) process.

6. The method of claim 1, wherein said annealing step is performed from about 800 to 900° C. for about 10 to 20 seconds.

7. The method of claim 1, wherein the gate dielectric layer is comprised of SiN.

8. A method of forming an ultra-thin buffer oxide layer, comprising the following steps:
providing a silicon substrate having STI regions formed therein separating at least one active area; said silicon substrate having an upper surface;
forming a sacrificial oxide layer over said silicon substrate and said STI regions; said sacrificial oxide layer having a thickness of from about 95 to 105 Å;
implanting oxygen within said silicon substrate; said oxygen implant having a peak concentration proximate said upper surface of said silicon substrate;
stripping and removing said sacrificial oxide layer;
forming a gate dielectric layer over said silicon substrate; said gate dielectric layer having a thickness of from about 10 to 50 Å;
depositing a conductor layer over said gate dielectric layer; said conductor layer having a thickness of from about 2400 to 2600 Å;
annealing the structure to form ultra-thin buffer oxide layer between said silicon substrate and said gate dielectric layer; said ultra-thin buffer oxide layer having a thickness of from about 3 to 15 Å thick.

9. The method of claim 8, wherein said sacrificial oxide layer is about 100 Å thick; said gate dielectric layer is from about 20 to 30 Å; said conductor layer is about 2500 Å thick; and said ultra-thin buffer oxide layer is from about 3 to 10 Å thick.

10. The method of claim 8, wherein said oxygen implantation is performed at a dose from about $1E^{14}$ to $1E^{16}$ cm$^{-2}$ and an energy from about 10 to 50 keV.

11. The method of claim 8, wherein said gate dielectric layer is formed using a Rapid Thermal Nitridation (RTN) process.

12. The method of claim 8, wherein said annealing step is performed from about 800 to 900° C. for about 10 to 20 seconds.

13. The method of claim 8, wherein the gate dielectric layer is comprised of SiN.

14. A method of forming an ultra-thin buffer oxide layer, comprising the following steps:

providing a silicon substrate having STI regions formed therein separating at least one active area; said silicon substrate having an upper surface;
forming a gate dielectric layer over said silicon substrate and said STI regions;
forming a sacrificial oxide layer over said gate dielectric layer;
implanting oxygen within said silicon substrate; said oxygen implant having a peak concentration proximate said upper surface of said silicon substrate;
stripping and removing said sacrificial oxide layer;
depositing a conductor layer over said gate dielectric layer;
annealing the structure to form ultra-thin buffer oxide layer between said silicon substrate and said gate dielectric layer.

15. The method of claim 14, wherein said gate dielectric layer is from about 10 to 50 Å; said sacrificial oxide layer is from about 95 to 105 Å thick; said conductor layer is from about 2400 to 2600 Å thick; and said ultra-thin buffer oxide layer is from about 3 to 15 Å thick.

16. The method of claim 14, wherein said gate dielectric layer is from about 20 to 30 Å; said sacrificial oxide layer is about 100 Å thick; said conductor layer is about 2500 Å thick; and said ultra-thin buffer oxide layer is from about 3 to 10 Å thick.

17. The method of claim 14, wherein said oxygen implantation is performed at a dose from about $1E^-$ to $1E^{16}$ cm$^{-2}$ and an energy from about 10 to 50 keV.

18. The method of claim 12, wherein said gate dielectric layer formation includes the steps of:
performing a Rapid Thermal Nitridation (RTN) of said silicon substrate; and
forming a gate dielectric layer over said silicon substrate by chemical vapor deposition.

19. The method of claim 14, wherein the gate dielectric layer is comprised of SiN.

20. A method of forming an ultra-thin buffer oxide layer, comprising the following steps:
providing a silicon substrate having STI regions formed therein separating at least one active area; said silicon substrate having an upper surface;
forming a gate dielectric layer over said silicon substrate and said STI regions; said gate dielectric layer having a thickness of from about 10 to 50 Å;
forming a sacrificial oxide layer over said gate dielectric layer; said sacrificial oxide layer having a thickness of from about 95 to 105 Å;
implanting oxygen within said silicon substrate; said oxygen implant having a peak concentration proximate said upper surface of said silicon substrate;
stripping and removing said sacrificial oxide layer;
depositing a conductor layer over said gate dielectric layer; said conductor layer having a thickness of from about 2400 to 2600 Å;
annealing the structure to form ultra-thin buffer oxide layer between said silicon substrate and said gate dielectric layer; said ultra-thin buffer oxide layer having a thickness from about 3 to 15 Å.

21. The method of claim 20, wherein said gate dielectric layer is from about 20 to 30 Å; said sacrificial oxide layer is about 100 Å thick; said conductor layer is about 2500 Å thick; and said ultra-thin buffer oxide layer is from about 3 to 10 Å thick.

22. The method of claim 20, wherein said oxygen implantation is performed at a dose from about $1E^{14}$ to $1E^{16}$ cm$^{-2}$ and an energy from about 10 to 50 keV.

23. The method of claim 20, wherein said gate dielectric layer formation includes the steps of:

performing a Rapid Thermal Nitridation (RTN) of said silicon substrate; and forming a gate dielectric layer over said silicon substrate by chemical vapor deposition.

24. The method of claim 20, wherein the gate dielectric layer is comprised of SiN.

25. A method of forming an ultra-thin buffer oxide layer, comprising the following steps:

providing a silicon substrate having an upper surface;

forming a sacrificial oxide layer over said silicon substrate;

implanting oxygen within said silicon substrate; said oxygen implant having a peak concentration proximate said upper surface of said silicon substrate;

stripping and removing said sacrificial oxide layer;

forming a gate dielectric layer over said silicon substrate;

depositing a conductor layer over said gate dielectric layer;

annealing the structure whereby said oxygen implant facilitates formation of an ultra-thin buffer oxide layer between said silicon substrate and said gate dielectric layer.

26. The method of claim 25, wherein said sacrificial oxide layer is from about 95 to 105 Å thick; said gate dielectric layer is from about 10 to 50 Å; said conductor layer is from about 2400 to 2600 Å thick; and said ultra-thin buffer oxide layer is from about 3 to 15 Å thick.

27. The method of claim 25, wherein said sacrificial oxide layer is about 100 Å thick; said gate dielectric layer is from about 20 to 30 Å; said conductor layer is about 2500 Å thick; and said ultra-thin buffer oxide layer is from about 3 to 10 Å thick.

28. The method of claim 25, wherein said oxygen implantation is performed at a dose from about $1E^{14}$ to $1E^{16}$ cm$^{-2}$ and an energy from about 10 to 50 keV.

29. The method of claim 25, wherein said gate dielectric layer is formed using a Rapid Thermal Nitridation (RTN) process.

30. The method of claim 25, wherein said annealing step is performed from about 800 to 900° C. for about 10 to 20 seconds.

* * * * *

UNITED STATES PATENT AND TRADEMARK OFFICE
CERTIFICATE OF CORRECTION

PATENT NO. : 6,458,717 B1
DATED : October 1, 2002
INVENTOR(S) : James Yong Meng Lee, Xia Li and Yunqiang Zhang It is certified that error appears in the above-identified patent and that said Letters Patent is hereby corrected as shown below:

<u>Title page,</u>
Item [75], delete "Yunqzang Zhang", and replace with -- Yunqiang Zhang --.

Signed and Sealed this

Fourth Day of March, 2003

JAMES E. ROGAN
*Director of the United States Patent and Trademark Office*